US009449881B1

(12) United States Patent
Sung et al.

(10) Patent No.: US 9,449,881 B1
(45) Date of Patent: Sep. 20, 2016

(54) METHODS OF FORMING FINS FOR FINFET SEMICONDUCTOR DEVICES AND THE RESULTING DEVICES

(71) Applicant: GLOBALFOUNDRIES Inc., Grand Cayman (KY)

(72) Inventors: Min Gyu Sung, Latham, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/710,053

(22) Filed: May 12, 2015

(51) Int. Cl.
*H01L 21/8234* (2006.01)
*H01L 21/311* (2006.01)
*H01L 21/308* (2006.01)
*H01L 21/764* (2006.01)
*H01L 21/762* (2006.01)
*H01L 21/3105* (2006.01)
*H01L 29/66* (2006.01)

(52) U.S. Cl.
CPC ..... *H01L 21/823431* (2013.01); *H01L 21/308* (2013.01); *H01L 21/31051* (2013.01); *H01L 21/31144* (2013.01); *H01L 21/764* (2013.01); *H01L 21/76224* (2013.01); *H01L 21/823481* (2013.01); *H01L 29/6681* (2013.01); *H01L 29/66795* (2013.01)

(58) Field of Classification Search
CPC .................................................. H01L 29/6681
See application file for complete search history.

(56) References Cited

U.S. PATENT DOCUMENTS

| 8,697,515 | B2 * | 4/2014 | Yin | H01L 21/823821 257/E21.409 |
| 8,703,557 | B1 * | 4/2014 | Cai | H01L 21/00 257/347 |
| 8,753,940 | B1 * | 6/2014 | Wei | H01L 21/823431 257/E21.429 |
| 9,171,752 | B1 * | 10/2015 | Wu | H01L 21/76224 |
| 2015/0340272 | A1 * | 11/2015 | Chen | H01L 21/76224 257/401 |
| 2015/0357439 | A1 * | 12/2015 | Liu | H01L 29/66795 257/401 |

* cited by examiner

*Primary Examiner* — Stephen W Smoot
(74) *Attorney, Agent, or Firm* — Amerson Law Firm, PLLC

(57) ABSTRACT

A method includes forming a plurality of fins above a substrate, forming at least one dielectric material above and between the plurality of fins, and forming a mask layer above the dielectric material. The mask layer has an opening defined therein. At least one etching process is performed to remove a portion of the at least one dielectric material exposed by the opening so as to expose a top surface portion and sidewall surface portions of at least one fin in the plurality of fins. The at least one dielectric material remains above the substrate adjacent the at least one fin. An etching process is performed to remove the at least one fin.

19 Claims, 5 Drawing Sheets

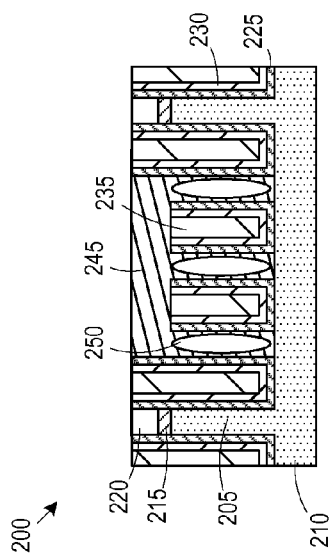
Figure 2A (Prior Art)
Figure 2B (Prior Art)
Figure 2C (Prior Art)

METHODS OF FORMING FINS FOR FINFET SEMICONDUCTOR DEVICES AND THE RESULTING DEVICES

BACKGROUND OF THE INVENTION

1. Field of the Invention

The present disclosure generally relates to the fabrication of integrated circuits, and, more particularly, to various methods of forming fins for FinFET semiconductor devices and the resulting semiconductor devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art integrated circuit product 100 that is formed above a semiconductor substrate 105. In this example, the product 100 includes five illustrative fins 110, 115, a shared gate structure 120, a sidewall spacer 125 and a gate cap 130. The product 100 implements two different FinFET transistor devices (N-type and P-type) with a shared gate structure. The gate structure 120 is typically comprised of a layer of insulating material (not separately shown), e.g., a layer of high-k insulating material or silicon dioxide, and one or more conductive material layers (e.g., metal and/or polysilicon) that serve as the gate electrode for the transistors on the product 100. The fins 110, 115 have a three-dimensional configuration. The portions of the fins 110, 115 covered by the gate structure 120 define the channel regions of the FinFET transistor devices on the product 100. An isolation structure 135 is formed between the fins 110, 115. The fins 110 are associated with a transistor device of a first type (e.g., N-type), and the fins 115 are associated with a transistor device of a complementary type (e.g., P-type). The gate structure 120 is shared by the N-type and P-type transistors, a common configuration for memory products, such as static random access memory (SRAM) cells.

Typically, fins are initially formed in a regular array across a substrate. To define separate transistor devices, the length of the fins may be adjusted and some fins or portions of fins may be removed. For example, a fin cut or "FC cut" process involves cutting or removing portions of fins beneath an opening defined in an FC cut mask. The long axis of the opening in the FC cut mask typically runs in a direction that is parallel to the width of the fins, i.e., the fins are "cross-cut" during the FC cut process. In contrast to the FC cut process, fins are also cut in what is referred to as an active region cut process, or "RX cut" process. In the RX cut process, the portions of the fins that are to remain are protected or covered by the RX cut mask. Thus, in the RX cut process, portions of the fins not protected by the RX cut mask are removed. For example, during the RX cut process, one or more of the fin segments (not covered by the RX cut mask) that are positioned between other parallel-positioned fin segments (that are covered by the RX cut mask) may be removed (e.g., one or more fins may be removed in the region between the fins 110 and the fins 115).

In the RX cut process, the dielectric material above the fin portions to be removed is removed to expose only the upper surface of the underlying fin portions that are to be removed. A subsequent isotropic etch process removes the exposed fin portions. An isotropic etch process is used to avoid alignment problems associated with anisotropic etch processes given the small pitch of the fins. Alignment errors may result in leaving unwanted portions of fins or damaging remaining fins if an anisotropic etch were to be used. Because only the top surface of the fin is exposed during the isotropic etch, the etch front moves generally vertically downward from the exposed top of the fin toward the substrate.

FIGS. 2A-2C are cross-section views of a device 200 showing a plurality of fins 205 defined above a substrate 210. The fins 205 may be defined using a variety of materials, such as silicon, an alloy of silicon, such as silicon germanium, or other semiconducting materials. In FIGS. 2A-2C, the cross-section is taken in a direction perpendicular to the long axis of the fins 205 (i.e., in the gate width direction of the device 200). An oxide cap layer 215 and a nitride cap layer 220 (previously used as hard mask layers to pattern the fins 205 in the substrate 210) are present above some of the fins 205. Liners 225, 230 may be formed above the fins 205. A dielectric layer 235 may be formed between the fins 205.

As shown in FIG. 2A, the cap layers 215, 220 and a portion of the dielectric layer 235 were selectively removed from above the fins 205 that are to be removed during the RX cut process. The cap layers 215, 220 remain positioned above the fins 205 that are to be retained.

FIG. 2B illustrates the device 200 after an isotropic etch process was performed to remove the fins 205 that are no longer covered by the cap layers 215, 220, thereby defining recesses 240 in the vacated regions.

FIG. 2C illustrates the device 200 after a deposition process was performed to form a dielectric layer 245 above the fins 205. In some cases, the dielectric layer 245 does not completely fill the recesses 240 thereby defining air gaps 250. During subsequent process steps, the dielectric layers 235, 245 are recessed to define an isolation structure between the remaining fins 205 and expose the sidewalls of the fins 205. After this recessing, the air gaps 250 are opened due to their height substantially being the same as the height of the fins 205. The air gaps 250 represent undesired trenches in the structure that may result in the creation of significant defects during subsequent processing, such as shorts.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for FinFET semiconductor devices, and the resulting semiconductor devices. One method includes, among other things, forming a plurality of fins above a substrate, forming at least one dielectric material above and between the plurality of fins, and forming a mask layer above the dielectric material. The mask layer has an opening defined therein. At least one etching process is performed to remove a portion of the at least one dielectric material exposed by the opening so as to expose a top surface portion and sidewall surface portions of at least one fin in the plurality of fins. The at least one dielectric material remains above the substrate adjacent the at least one fin. An etching process is performed to remove the at least one fin.

Another illustrative method disclosed herein includes, among other things, forming a plurality of fins above a substrate. Each fin has a cap layer formed on a top surface. A liner layer is formed above the plurality of fins and the cap layer. A first dielectric layer is formed above the liner layer. The first dielectric layer is planarized to expose a top surface of the cap layer. A mask layer is formed above the first dielectric layer. The mask layer has an opening defined therein that exposes at least one fin in the plurality of fins. A portion of the cap layer, the liner layer, and the first dielectric layer exposed by the opening is removed so as to expose top and sidewall surface portions of the at least one fin. The first dielectric layer remains above the substrate adjacent the at least one fin. An etching process is performed to remove the at least one fin exposed by removing the portion of the cap layer, the liner layer and the first dielectric layer. A recess is defined by the removal of the at least one fin. A second dielectric layer is formed above the at least one fin to at least partially fill the recess.

BRIEF DESCRIPTION OF THE DRAWINGS

The disclosure may be understood by reference to the following description taken in conjunction with the accompanying drawings, in which like reference numerals identify like elements, and in which:

FIGS. 2A-2C depict the formation of air gaps caused by prior art RX cut processes.

Figure 1:
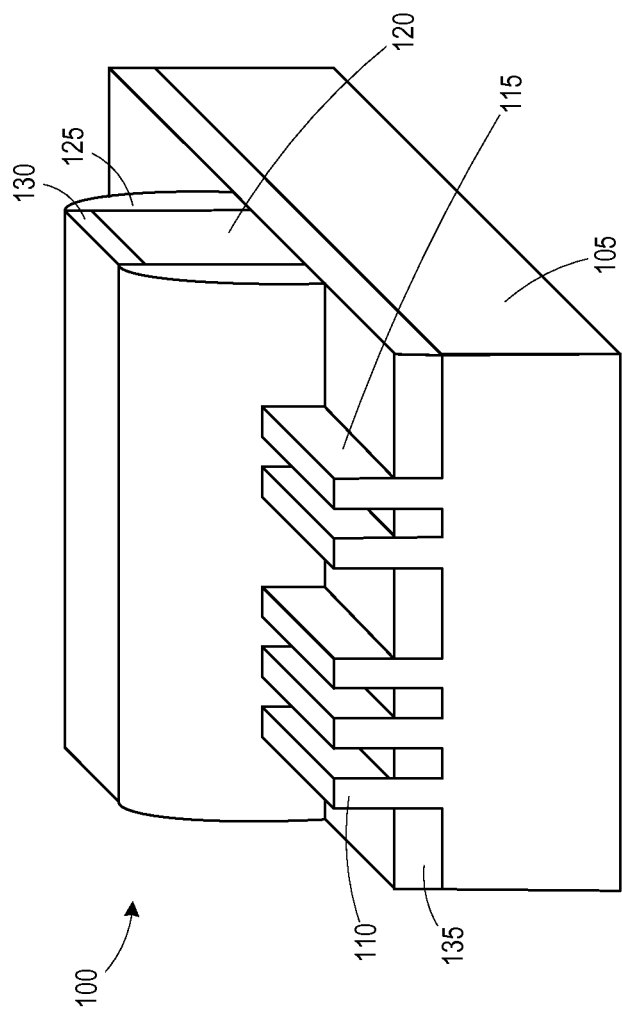
FIG. 1 is a plan view of one illustrative embodiment of a prior art semiconductor product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming fins for FinFET semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 3A-3I depict one illustrative method disclosed for forming fins for FinFET semiconductor devices and the resulting semiconductor devices. The illustrative product 300 includes a plurality of fins 305 formed in a semiconductor substrate 310. The substrate 310 may have a variety of configurations, such as the depicted bulk silicon configuration. The substrate 310 may also have a silicon-on-insulator (SOI) configuration that includes a bulk silicon layer, a buried insulation layer and an active layer, wherein semiconductor devices are formed in and above the active layer. The substrate 310 may be formed of silicon or silicon germanium or it may be made of materials other than silicon, such as germanium. Thus, the terms "substrate" or "semiconductor substrate" should be understood to cover all semiconducting materials and all forms of such materials. The substrate 310 may have different layers.

Figure 3A:
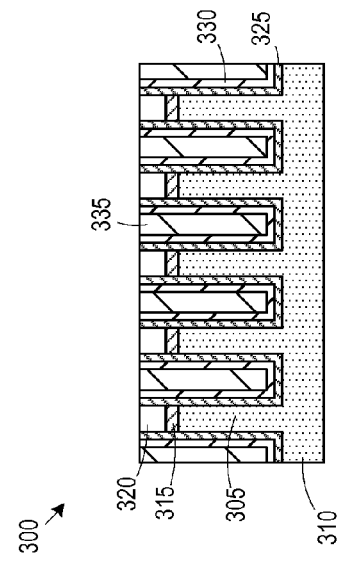
FIGS. 3A-3I depict one illustrative method disclosed for forming fins for a semiconductor product and the resulting semiconductor devices.

FIG. 3A depicts the product 300 at a point in fabrication wherein several process operations have been performed. First, the plurality of fins 305 were formed using cap layers 315, 320 (e.g., silicon dioxide and silicon nitride, respectively) as a patterned etch mask. In general, the fins 305 define an active region for forming devices, such as FinFET transistors. Next, liner layers 325, 330 (e.g., silicon dioxide and silicon nitride, respectively) were formed above the fins 305. Although a liner having two portions 325, 330 is shown, in some embodiments, more or less layers may be used in the liner. The illustrative product 300 disclosed herein is depicted as being comprised of five illustrative fins 305. However, as will be recognized by those skilled in the art after a complete reading of the present application, the methods and devices disclosed herein may be employed when manufacturing devices having any number of fins. A dielectric layer 335 (e.g., silicon dioxide, a low-k dielectric material, a flowable oxide, etc.) was then formed between the fins 305 to serve as an isolation structure.

Figure 3B:
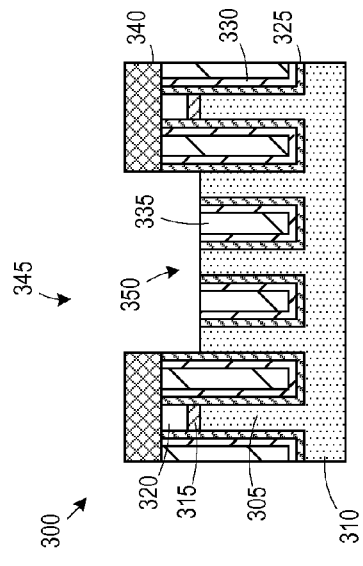

FIG. 3B illustrates the product 300 after a planarization process was performed to remove portions of the dielectric layer 335 and the liner layers 325, 330 to expose the cap layer 320.

Figure 3C:
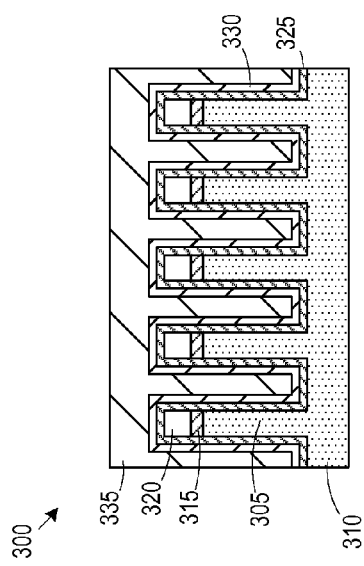

FIG. 3C illustrates the product 300 after a plurality of processes were performed to deposit and pattern a hard mask layer 340 above the dielectric layer 335. The hard mask layer 340 has an opening 345. In the illustrated embodiment, the hard mask layer 340 was formed using a photolithography stack, including an organic planarization (OPL) layer, an anti-reflective coating (ARC) layer and a photoresist layer. The ARC layer was formed above the OPL layer and the photoresist was formed above the ARC layer. The photoresist layer was exposed to radiation using a reticle and developed to generate a pattern. The photoresist pattern was transferred to the ARC and OPL layers, and the photoresist and ARC layers were removed. Thus, in some embodiments, the hard mask layer 340 may be the remaining OPL layer. In general, the opening 345 is sized based on the edges of the fins 305 that are to be removed rather than the edges of the liner layer 330. As described in greater detail below, this provides margin for overlay errors.

Figure 3D:
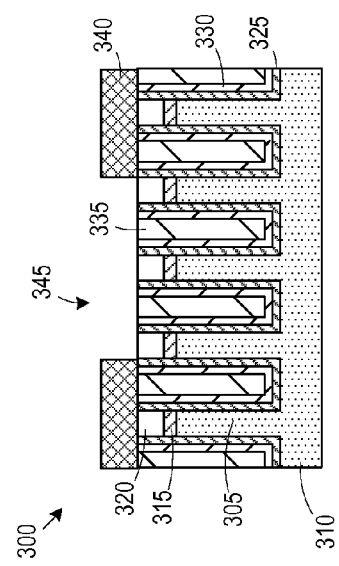

FIG. 3D illustrates the product 300 after an etch process (e.g., anisotropic reactive ion etch) was performed to remove the cap layers 315, 320, the liner layers 325, 330, and the dielectric material 335 exposed by the opening 345 to define a trench 350 having a bottom surface that exposes the top surface of the fins 305 to be subsequently removed.

Figure 3F:
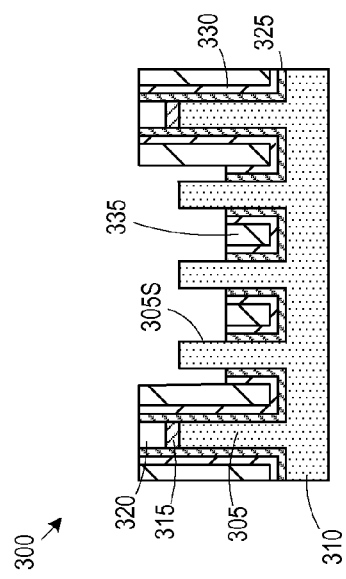
Figure 3H:
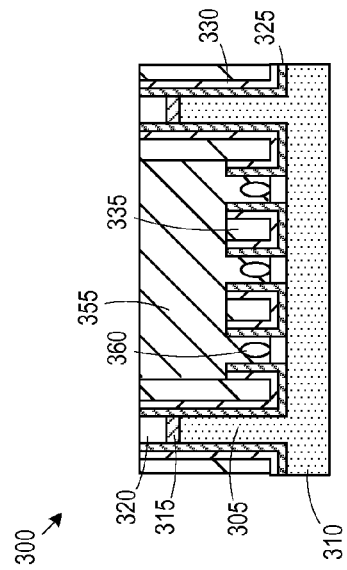
Figure 3E:
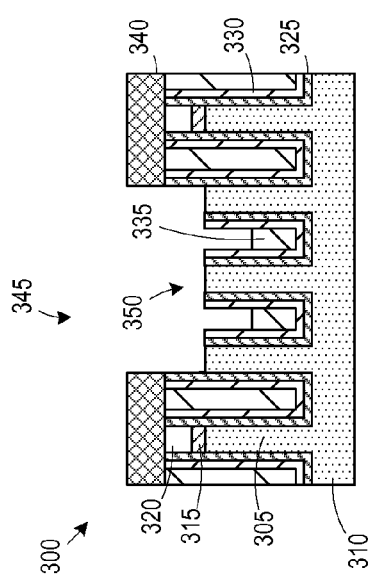

FIG. 3E illustrates the product 300 after an etch process (e.g., anisotropic reactive ion etch) was performed to etch the dielectric material 335 exposed by the opening 345 selectively to the materials of the fin 305 and the liners 325 and 330.

FIG. 3F illustrates the product 300 after one or more etch processes (e.g., isotropic etches) were performed to selectively remove the portions of the liners 325, 330 exposed by the opening 345, thereby exposing sidewalls 305S of the exposed fins 305, and to remove the mask layer 340.

Figure 3G:
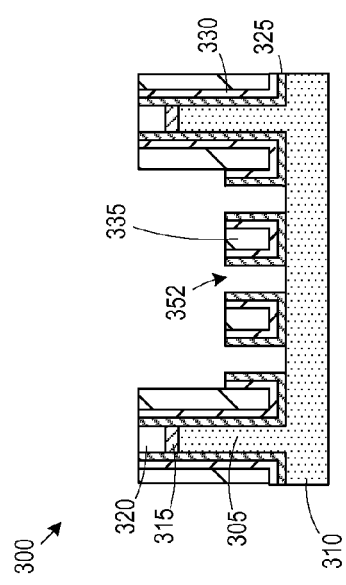

FIG. 3G illustrates the product 300 after an isotropic etch process (i.e., RX cut) was performed to remove the exposed portions of the fins 305 creating recesses 352. Because the sidewalls 305S of the fins 305 are exposed, the isotropic etch process may proceed in a generally downward vertical direction from the top surface of the fins 305 toward the bulk of the substrate 310 and in a generally lateral or horizontal direction starting at the exposed sidewalls 305S. Of course, in actuality, the etch front may proceed along a front that is some form of a combination of the above-described vertical and horizontal directions, but by exposing the sidewalls the fins 305, the etch process can be performed faster.

FIG. 3H illustrates the product 300 after a deposition process was performed to deposit a dielectric layer 355 (e.g., silicon dioxide, a low-k dielectric material, a flowable oxide, etc.) above the fins 305 and after a planarization process was performed to expose the cap layer 320. Air gaps 360 may be defined in the dielectric layer 355 in the in the recesses 352 created by removing the fins 305. However, due to the relatively shorter height of recesses 352 (as compared to those in the prior art discussed above), the chances of formation of the air gaps 360 as well as the size of any such air gaps 360 that do form are reduced compared to the prior art process flow illustrated in FIG. 2C due to the exposing of the sidewalls 305S of the fins 305 prior to the isotropic RX cut etch. As noted above, in some cases, due to the reduced aspect ratio of the recesses 352, the formation of the air gaps 360 may be substantially avoided.

Figure 3I:
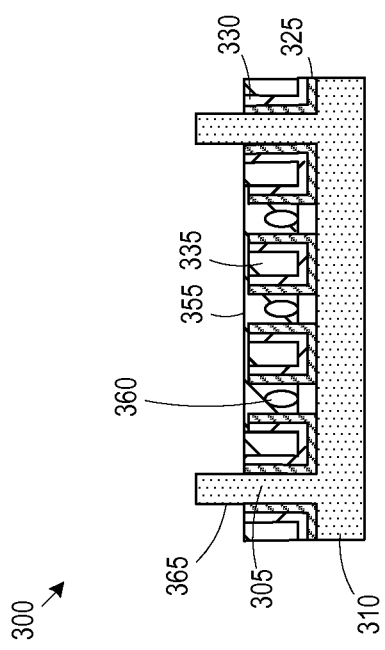

FIG. 3I illustrates the product 300 after one or more etch processes were performed to selectively remove the cap layers 315, 320, to recess the dielectric layer 355, and to remove the exposed portions of the liners 325, 330 thereby exposing sidewalls 365 of the fins 305. Due to the reduced height of the air gaps 360 (as compared to FIG. 2C), the air gaps 360 remain encapsulated in the dielectric layer 355, thereby reducing the likelihood of defects.

Further processing steps may be performed to complete the fabrication of the product 300, such as forming a gate electrode, doping source and drain regions, forming contacts, etc. The process flow illustrated above has several advantages. Because the RX cut etch process flow described herein results in small air gaps or avoids the formation of them entirely, the defect rate associated with the product 300 is reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of fins above a substrate;
    forming at least one dielectric material above and between said plurality of fins, said dielectric material including a cap layer disposed on top surface portions of said plurality of fins;
    forming a mask layer above said dielectric material, said mask layer having an opening defined therein;
    performing at least one etching process to remove a portion of said at least one dielectric material exposed by said opening so as to remove portions of said dielectric material and cap layer exposed by said opening to expose said top surface portion and sidewall surface portions of at least one fin in said plurality of fins, wherein said at least one dielectric material remains above said substrate adjacent said at least one fin; and performing an etching process to remove said at least one fin.

2. The method of claim 1, wherein a recess is defined by the removal of said at least one fin, and the method further comprises forming a first dielectric layer to at least partially fill said recess.

3. The method of claim 2, wherein an air gap is defined in said first dielectric layer disposed in said recess.

4. The method of claim 1, wherein removing said dielectric material comprises forming a trench in said dielectric material to expose a top surface of said at least one fin.

5. The method of claim 4, wherein removing said dielectric material further comprises removing additional dielectric material to expose said sidewall surface portions.

6. The method of claim 1, wherein forming said dielectric material comprises:

forming a liner layer above said cap layer and above said plurality of fins; and forming a first dielectric layer above said liner layer and between said plurality of fins.

7. The method of claim 6, wherein removing said dielectric material comprises:

performing a first etch process to define a trench in said dielectric material by removing portions of said cap layer, said liner layer and said first dielectric layer to expose said top surface portion of said at least one fin;

performing a second etch process to selectively remove portions of said first dielectric layer exposed by said opening to expose said liner layer; and performing a third etch process to selectively remove said liner layer disposed above said sidewall surface portions.

8. The method of claim 7, wherein said second etch process comprises an anisotropic etch process selective to a material of said first dielectric layer.

9. The method of claim 8, wherein said third etch process comprises at least one isotropic etch process selective to a material of said liner layer.

10. The method of claim 9, wherein said liner layer comprises a first liner layer and a second liner layer formed above said first liner layer, and said third etch process comprises a first isotropic etch process selective to a material of said second liner layer and a second isotropic etch process selective to a material of said first liner layer.

11. The method of claim 7, wherein said first etch process comprises a non-selective anisotropic etch that removes portions of said cap layer, said liner layer and said dielectric layer.

12. The method of claim 6, wherein a recess is defined by the removal of said at least one fin, and the method further comprises forming a second dielectric layer to at least partially fill said recess.

13. The method of claim 12, wherein an air gap is defined in said second dielectric layer disposed in said recess.

14. The method of claim 12, further comprising recessing said dielectric material and said second dielectric layer to expose at least one remaining fin in said plurality of fins, wherein said second dielectric layer remains above said air gap after said recessing.

15. A method, comprising:

forming a plurality of fins above a substrate, each fin having a cap layer formed on a top surface;

forming a liner layer above said plurality of fins and said cap layer;

forming a first dielectric layer above said liner layer;

planarizing said first dielectric layer to expose a top surface of said cap layer;

forming a mask layer above said first dielectric layer, said mask layer having an opening defined therein that exposes at least one fin in said plurality of fins;

removing a portion of said cap layer, said liner layer and said first dielectric layer exposed by said opening so as to expose top and sidewall surface portions of said at least one fin, wherein said first dielectric layer remains above said substrate adjacent said at least one fin;

performing an etching process to remove said at least one fin exposed by removing said portion of said cap layer, said liner layer and said first dielectric layer, wherein a recess is defined by the removal of said at least one fin; and forming a second dielectric layer to at least partially fill said recess.

16. The method of claim 15, wherein an air gap is defined in said second dielectric layer disposed in said recess.

17. The method of claim 16, further comprising recessing said first dielectric layer and said second dielectric layer to expose at least one remaining fin in said plurality of fins, wherein said second dielectric layer remains above said air gap after said recessing.

18. The method of claim 15, wherein said etching process comprises an isotropic etching process.

19. The method of claim 15, wherein removing said portion of said cap layer, said liner layer and said first dielectric layer exposed by said opening comprises:

performing a first etch process to define a trench in said cap layer, said liner layer and said first dielectric layer to expose said top surface portions of said at least one fin;

performing a second etch process to selectively remove portions of said first dielectric layer exposed by said opening to expose said liner layer; and performing a third etch process to selectively remove said liner layer disposed above said sidewall surface portions of said at least one fin.

* * * * *